United States Patent [19]

Meisenheimer

[11] Patent Number: 4,560,838
[45] Date of Patent: Dec. 24, 1985

[54] APPARATUS FOR INTEGRATING A PLURALITY OF AUDIO SYSTEMS

[75] Inventor: William L. Meisenheimer, Agoura, Calif.

[73] Assignee: Water Jet Corporation, Canoga Park, Calif.

[21] Appl. No.: 572,701

[22] Filed: Jan. 20, 1984

[51] Int. Cl.⁴ .......................... G09B 5/04; H04M 1/00
[52] U.S. Cl. .................................... 179/81 R; 381/81; 381/107; 381/123; 179/81 B
[58] Field of Search .............. 179/81 R, 81 B; 381/80, 381/81, 85, 107, 55, 72, 119, 123, 98, 99; 369/1, 2, 3

[56] References Cited

U.S. PATENT DOCUMENTS 4,306,114 12/1981 Callahan ............................ 369/3 X Primary Examiner—James L. Dwyer
Attorney, Agent, or Firm—I. Morley Drucker; Howard N. Sommers

[57] ABSTRACT

An apparatus for integrating a plurality of audio systems, for enabling a selected one of a plurality of audio inputs to be transmitted as an audio output. It is adapted to integrate, for example, a stereo sound system and a telephone sound system, so as to be operable from a control panel adapted to be mounted in the wall of a bathtub or the like.

The apparatus is adapted to enable elements of the integrated system to be shared in common by a plurality of audio inputs, so as to generate a selected audio output.

The apparatus includes a voltage-controlled amplifier, for controlling the selected audio input signal with a direct-current control voltage. It further includes a plurality of parallel circuits, for generating the direct-current control voltage, one such circuit for each of the plurality of audio inputs, and elements for switching from one such circuit to another.

Each such parallel control voltage generating circuit, and the associated audio input signal, are switchable by the switching elements into and out of connection with the voltage-controlled amplifier, in response to the control input signal associated with the selected audio input signal.

7 Claims, 2 Drawing Figures

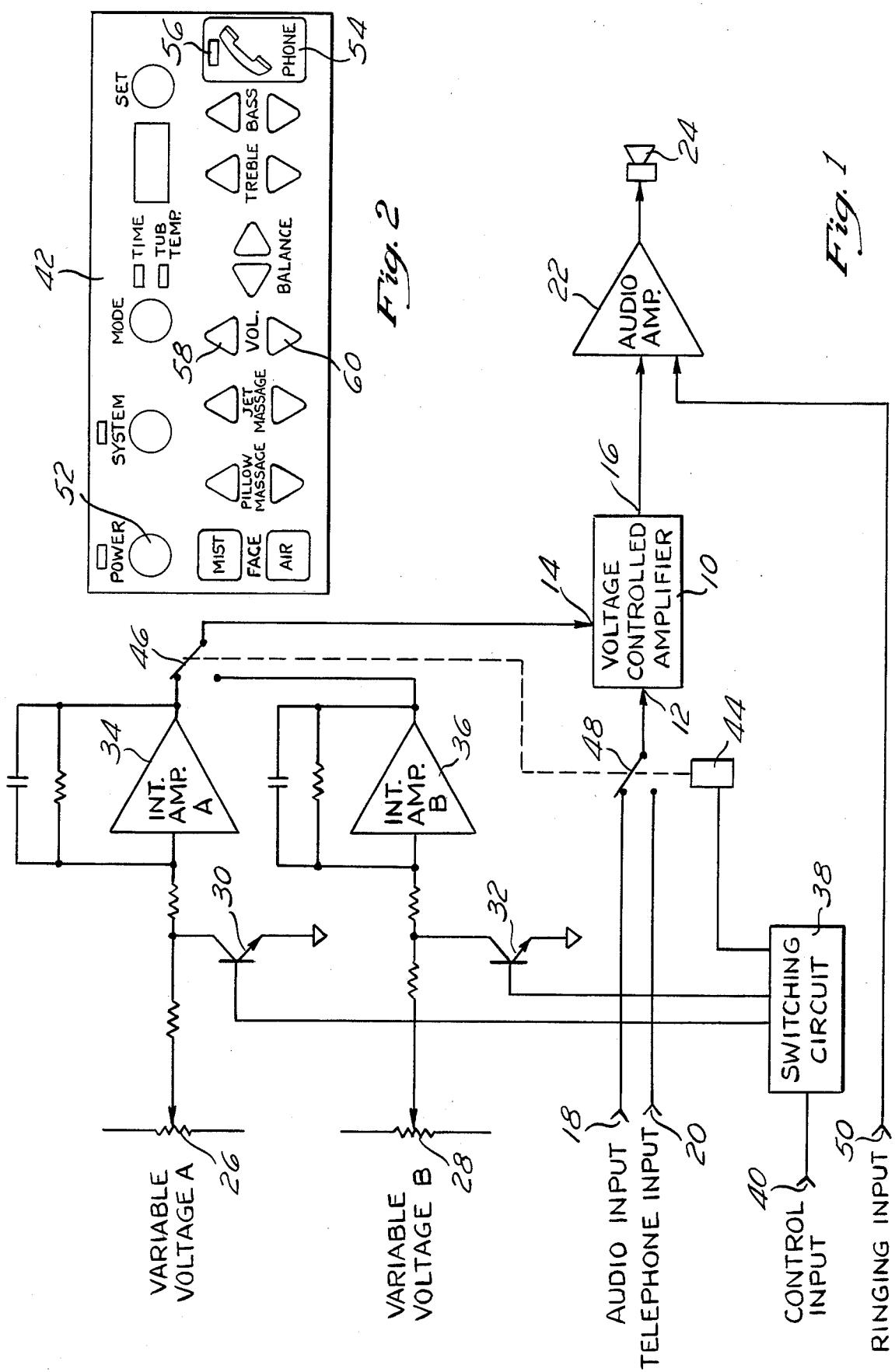

APPARATUS FOR INTEGRATING A PLURALITY OF AUDIO SYSTEMS

BACKGROUND OF THE INVENTION

The invention relates generally to audio systems. It relates specifically to an apparatus for integrating a plurality of audio systems.

To the best of my knowledge, the prior art does not disclose an apparatus for integrating a plurality of audio systems, such as a stereo sound system and a telephone sound system, to enable elements thereof to be shared so as to generate a selected audio output, operable from a control panel adapted to be mounted in the wall of a bathtub or the like.

It further does not disclose such an apparatus which is controllable, efficiently and effectively, by direct-current control voltage, generated by one of a plurality of parallel circuits, switchable so as to generate the desired audio output.

It still further does not disclose such an apparatus which is switchable from one audio output to another, in a manner such that there is a smooth decrease in one audio output and increase in the other, and such that there is minimum switching noise.

SUMMARY OF THE INVENTION

The invention is adapted to overcome the above problems, as well as others, associated with the prior art. It provides an efficient and effective integrating apparatus for enabling a selected one of a plurality of audio inputs to be transmitted as an audio output. It further enables a plurality of audio systems to share elements in common, for generating a selected audio output from a selected one of a plurality of audio inputs.

The apparatus further provides voltage-controlled amplification of the selected audio input signal, for efficiently controlling the audio output signal with a direct-current voltage. It still further provides controlled switching, to smoothly switch from one audio output signal to another with minimum switching noise.

The apparatus is particularly adapted, for example, to integrate a stereo sound system and a telephone sound system, so as to be operable from a control panel adapted to be mounted in the wall of a bathtub or the like.

The apparatus includes a voltage-controlled amplifier, for enabling control of the selected audio input signal levels with a direct-current control voltage. It further includes a plurality of parallel circuits for generating direct-current control voltage, one such circuit for each of the plurality of audio inputs, switchable relative to the voltage-controlled amplifier. Each such circuit generates the direct-current control voltages for the voltage-controlled amplifier responsive to a variable voltage associated with the selected audio input signal, as amplified in an associated integrating amplifier.

The apparatus still further includes elements for switching the parallel control voltage generating circuits into and out of connection with the voltage-controlled amplifier. Such switching elements are operable to switch in response to a control input signal associated with the selected audio input signal.

The elements of the apparatus may, for example, be operable from a control panel, adapted to be mounted in the wall of a bathtub or the like, and the audio input signals integrated therein may comprise stereo and telephone sound systems.

In operation, selection of the desired audio input at the control panel generates an associated control input signal, which generates switching of the switching elements. Such switching causes the selected audio input signal and associated parallel direct-current control voltage generating circuit to be switched into connection with the voltage-controlled amplifier, and the non-selected signal and circuit to be switched out of connection with the voltage-controlled amplifier. Such switching is effected thereby so as to result in a smooth decrease in the non-selected audio output and increase in the selected audio output, with minimum switching noise.

The selection of the desired audio signal by actuation of the control input signal, and responsive actuation of the switching elements and connection of the control voltage generating circuit, causes generation of the direct current control voltage at the input therefor in the voltage-controlled amplifier.

The voltage-controlled amplifier generates an audio output signal from the selected audio input. It controls the audio input signal levels with the control voltage generated by the amplified variable voltage in the control voltage generating circuit, switched by the switching elements so as to be connected to the voltage-controlled amplifier. The audio output signal is thereby generated from the selected one of the plurality of audio inputs in an efficient and effective manner.

DESCRIPTION OF THE DRAWINGS

FIG. 1 is a schematic diagram of an audio system integrating apparatus, pursuant to the invention; and FIG. 2 is an elevational view of a control panel, adapted to be installed in the wall of a bathtub, for use with the audio system integrating apparatus of the invention.

DETAILED DESCRIPTION OF THE INVENTION

The invention, as shown in FIGS. 1 and 2, and as described herein, comprises an apparatus for integrating a plurality of audio systems, to enable a selected one of a plurality of audio inputs to be transmitted as an audio output. It is adapted to enable elements of the integrated system to be shared in common by a plurality of audio inputs for generating a selected audio output.

The apparatus is particularly adapted, for example, as shown herein, to integrate a stereo sound system and a telephone sound system, so as to be operable from a control panel adapted to be mounted in the wall of a bathtub, whirlpool bath, or the like. The apparatus shown herein is a single channel system, but it may be readily adapted, by known techniques not described herein, to accomodate a dual-channel or other system.

The apparatus includes a voltage-controlled amplifier 10, as shown in FIG. 1. Voltage-controlled amplifier 10 includes inputs 12 and 14, and output 16. Input 12 is adapted to receive an audio input signal, for example either stereo input signal 18 or telephone input signal 20. Input 14 is adapted to receive a control voltage. Output 16 is adapted to transmit an audio output signal comprising the audio input signal as controlled by the control voltage. Output 16 is connected to an audio amplifier 22, which is connected to a speaker 24.

The apparatus, as shown in FIG. 1, further includes a plurality of parallel circuits for generating the direct-current control voltage applied at input 14 of voltage-controlled amplifier 10.

Each parallel direct-current control-voltage generating circuit includes a variable voltage element, as 26, 28, an electronic switch, as 30, 32, and an integrating amplifier, as 34, 36. For example, the control-voltage generating circuit associated in parallel with audio input signal 18 may include variable voltage element 26, electronic switch 30, and integrating amplifier 34. Further, the control-voltage generating circuit associated in parallel with audio input signal 20 may include variable voltage element 28, electronic switch 32, and integrating amplifier 36. Variable-voltage elements 26 and 28 may comprise, for example, an integrated circuit comprising a digitally controlled potentiometer, a manual potentiometer, or the like.

The apparatus, still further includes elements for switching from one of the control-voltage generating circuits to another, as shown in FIG. 1. The switching elements include a switching circuit 38, for controlling the operation of electronic switches 30 and 32 in the control-voltage generating circuits.

Switching circuit 38 is operable responsive to a control input signal 40, generated at the control panel 42 shown in FIG. 2. Control input signal 40 may be generated, for example, in a logic board in control panel 42, as by a flip-flop associated therewith.

The switching elements further include an electronic switch 44, connected to switching circuit 38, for controlling parallel operation of switches 46 and 48. Switch 46 is switchable at the outputs of each of the control-voltage generating circuits, and is connected to input 14 of voltage-controlled amplifier 10. Switch 48 is switchable at the inputs from each of the audio input signals 18 and 20, and is connected to input 12 of the voltage-controlled amplifier 10.

A ringing input signal 50 may further be connected as an input to audio amplifier 22, for use, for example, in conjunction with the telephone input signal 20.

Control panel 42, as shown in FIG. 2, may be adapted, for example, to be installed in the wall of a bathtub, whirlpool bath, or the like, to enable control and use of a selected one of a plurality of audio input signals from such panel. It may include, for example, push-button 52 for turning the power on and off, push-button 54 for turning the telephone sound system on and off, an indicator light 56 for indicating that the telephone is ringing, push-buttons 58 and 60 for increasing or decreasing the audio output signal volume, and other push-buttons associated with other system functions (not described herein).

In operation, the user may turn the apparatus on by pressing push-button 52, for power, on control panel 42. Upon turning the power on by pressing push-button 52, for example, audio input signal 18, comprising stereo sound, is generated as the audio output at speaker 24, in the mid-volume range thereof.

Upon pressing push-button 52, turning the power on, such actuates switching circuit 38, which turns electronic switch 32 on, putting the input to integrating amplifier 36 at ground. This causes the output of integrating amplifier 36 to integrate to ground.

Electronic switch 44 then causes switch 48 to connect the stereo input signal 18 to input 12 of voltage-controlled amplifier 10, and parallel switch 46 connects variable voltage element 26, electronic switch 30, and integrating amplifier 34 to input 14 of voltage-controlled amplifier 10. The output of voltage-controlled amplifier 10 is still at a minimum.

Electronic switch 30 is then turned off by switching circuit 38, responsive to the states of the control-voltage generating circuit, presenting the variable voltage to integrating amplifier 34. The output of integrating amplifier 34 integrates the input voltage to a voltage controlled by the amplifier gain and the value of the variable voltage. This causes the output of voltage-controlled amplifier 10 to rise, driving audio amplifier 22 with the stereo output. Adjustment of the volume of sound may then be effected by pressing push-button 58 or 60 on control panel 42, varying the voltage in variable voltage element 26. Other adjustments in the audio output may be effected by use of other push-buttons on panel 42.

When a telephone call is coming in to the system, for example, indicator light 56 on control panel 42 flashes with each ring thereof and several such rings are transmitted directly by ringing input 50 to audio amplifier 22 and speaker 24 as warbling ringing outputs.

The user may elect to take the telephone call, by pressing push-button 54 on control panel 50, generating control input signal 40. Audio input signal 20, comprising telephone sound, is then generated as the audio output at speaker 24, in the mid-volume range thereof, as described below.

Control input signal 40 causes switching circuit 38 to turn electronic switch 30 on, putting the input to integrating amplifier 34 at ground. This causes the output of integrating amplifier 34 to integrate to ground, which causes voltage-controlled amplifier 10 to decrease its output to a minimum.

Electronic switch 44 then causes switch 48 to connect telephone input signal 20 to input 12 of voltage-controlled amplifier 10, and parallel switch 46 connects variable voltage element 28, electronic switch 32, and integrating amplifier 36 to input 14 of voltage-controlled amplifier 10. The output of voltage-controlled amplifier 10 is still at a minimum.

Electronic switch 32 is then turned off by switching circuit 38, responsive to the states of the control-voltage generating circuits, presenting the variable voltage to integrating amplifier 36. The output of integrating amplifier 36 integrates the input voltage to a voltage controlled by the amplifier gain and the value of the variable voltage. This causes the output of voltage-controlled amplifier 10 to rise, driving audio amplifier 22 with the telephone output. Adjustment of the volume of sound may then likewise be effected for telephone sound by pressing push-button 58 or 60 on control panel 42, varying the voltage in variable voltage element 26. Other adjustments in the telephone audio output may likewise be effected by use of other push-buttons on panel 42.

To hang up the telephone, and return the system to stereo output, with audio input signal 18 again generated as the audio output at speaker 24, the user may again press push-button 54 on control panel 42. Such pressing of push-button 54 generates another control input signal 40, which activates switching circuit 38 as for initial "power on" condition previously described herein, with the addition that voltage-controlled amplifier 10 decreases its telephone audio output to a minimum upon switching electronic switch 36 to ground.

The apparatus enables integration of a plurality of audio systems, with elements of the integrated apparatus shared in common by the plurality of audio inputs.

This enables integration, for example, of a stereo sound system and a telephone sound system, for operation thereof from a control panel adapted to be mounted in the wall of a bathtub, whirlpool bath, or the like.

Voltage-controlled amplifier 10 enables control of the audio output signal with a direct current voltage, in an efficient and effective manner.

The plurality of parallel direct-current control-voltage generating circuits, each including a variable voltage element as 26, 28, an electronic switch, as 30, 32, and an integrating amplifier, as 34, 36, and the switching elements, including control input signal 40, switching circuit 38, electronic switch 44, and parallel switches 46 and 48, enable efficient operation and a smooth decrease in one audio output and increase in the other during the switching process, and minimize switching noise.

A preferred embodiment of the invention has been set forth above, for the purposes of explaining the invention. However, it is to be understood that variations may be made in such embodiment, which variations are nevertheless within the scope and spirit of the invention, as set forth in the claims herein.

I claim:

1. An apparatus for integrating a plurality of audio systems, adapted to enable selection of one of a plurality of audio input signals, and to enable the selected one of the plurality of audio input signals to be transmitted as an audio output signal, comprising:
    (a) means for enabling selection of one of the plurality of audio input signals;
    (b) means for controlling the selected audio input signal responsive to a direct-current control voltage;
    (c) a plurality of parallel means for generating the direct-current control voltage, each associated with an audio input signal; and
    (d) means for automatically selectively switching the control voltage generating means and the audio input signals relative to the signal controlling means so as to connect one of the control voltage generating means and the associated selected audio input signal to the signal controlling means responsive to a control input signal generated in association with the selected one of the plurality of audio input signals.

2. An apparatus as in claim 1, in which the signal controlling means comprise a voltage-controlled amplifier.

3. An apparatus as in claim 1, in which each of the plurality of parallel control voltage generating means includes means for generating a variable voltage, switching means, connected to the selective switching means and the variable voltage generating means, and an integrating amplifier, the input of which is connected to the switching means, the output of which is switchable by the selective switching means relative to the signal controlling means for connection thereto or disconnection therefrom.

4. An apparatus as in claim 1, in which the selective switching means includes a plurality of parallel switches, each connected to the output of one of the control-voltage generating means, and means for switching the parallel switches responsive to the state of the selective switching means.

5. An apparatus as in claim 1, in which one of the plurality of audio input signals comprises a stereo audio signal.

6. An apparatus as in claim 1, in which one of the plurality of audio input signals comprises a telephone audio signal.

7. An apparatus as in claim 1, in which the selection enabling means are adapted to be mounted in the wall of a bathtub or the like.

* * * * *